United States Patent
Yu et al.

(10) Patent No.: US 10,522,204 B1
(45) Date of Patent: Dec. 31, 2019

(54) MEMORY SIGNAL PHASE DIFFERENCE CALIBRATION CIRCUIT AND METHOD

(71) Applicant: REALTEK SEMICONDUCTOR CORPORATION, Hsinchu (TW)

(72) Inventors: Chun-Chi Yu, Hsinchu County (TW); Fu-Chin Tsai, Taipei (TW); Shih-Han Lin, Hsinchu County (TW); Chih-Wei Chang, Hsinchu County (TW); Gerchih Chou, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/183,348

(22) Filed: Nov. 7, 2018

(51) Int. Cl.
*G11C 7/22* (2006.01)
*G06F 3/06* (2006.01)

(52) U.S. Cl.
CPC ............ *G11C 7/222* (2013.01); *G06F 3/0604* (2013.01); *G06F 3/0659* (2013.01); *G06F 3/0673* (2013.01); *G11C 2207/2254* (2013.01)

(58) Field of Classification Search
CPC ..... G11C 7/222; G06F 3/0604; G06F 3/0659; G06F 3/0673
See application file for complete search history.

(56) References Cited

U.S. PATENT DOCUMENTS

| | | | | |
|---|---|---|---|---|
| 8,804,397 B2 * | 8/2014 | Aleksic | ...................... | H03L 7/24 365/129 |
| 9,570,130 B2 | 2/2017 | Yu et al. | | |
| 2018/0308532 A1 * | 10/2018 | Roh | ........................ | G11C 29/023 |
| 2019/0222410 A1 * | 7/2019 | Hsu | ........................ | G11C 7/222 |

OTHER PUBLICATIONS

JEDEC, Low Power Double Data Rate 4 (LPDDR4), Published: Mar. 2017. Committee(s): JC-42.6 https://www.jedec.org/standards-documents/docs/jesd209-4b.

* cited by examiner

*Primary Examiner* — Tri M Hoang
(74) *Attorney, Agent, or Firm* — WPAT, PC

(57) ABSTRACT

A memory signal phase difference calibration circuit includes: a clock generator providing clocks allowing a physical layer (PHY) circuit of DDR SDRAM to generate a data input/output signal (DQ) and a data strobe signal (DQS) for accessing a storage circuit; a calibration control circuit outputting a phase control signal according to an adjustment range to adjust the phase of a target signal (DQ or DQS), and outputting a calibration control signal; an access control circuit reading storage data representing predetermined data from the storage circuit according to the calibration control signal; a comparison circuit comparing the predetermined data with the storage data to output a result allowing the calibration control circuit to alter the adjustment range accordingly; and a phase controller outputting a clock control signal according to the phase control signal to set the phase of a target clock used for the PHY circuit generating the target signal.

20 Claims, 3 Drawing Sheets

MEMORY SIGNAL PHASE DIFFERENCE CALIBRATION CIRCUIT AND METHOD

BACKGROUND OF THE INVENTION

1. Field of the Invention

The present invention relates to a calibration circuit and a calibration method, especially to a memory signal phase difference calibration circuit and a memory signal phase difference calibration method.

2. Description of Related Art

In the design of some Double Data Rate Synchronous Dynamic Random Access Memory (DDR SDRAM) physical layer circuits, the phase difference between a data input/output signal (DQ) and a data strobe signal (DQS) is set to be constant (e.g., 90 degrees). Such constant phase difference complies with some DDR standards (e.g., Double Data Rate fourth generation (DDR4) standard and Low Power Double Data Rate third generation (LPDDR3) standard), but cannot meet the requirement of LPDDR4 standard. In order to comply with LPDDR4 standard, the design of DDR SDRAM physical layer circuits should be modified.

In LPDDR4 standard, the phase difference between DQ and DQS is between 200 picoseconds (ps) and 800 ps, the maximum phase difference variation caused by temperature variation is 0.6 ps/□, and the maximum phase difference variation caused by voltage variation is 33 ps/50 mv.

SUMMARY OF THE INVENTION

An object of the present invention is to provide a memory signal phase difference calibration circuit and a memory signal phase difference calibration method in compliance with a DDR standard (e.g., LPDDR4 standard).

The present invention discloses a memory signal phase difference calibration circuit. According to an embodiment of the calibration circuit, the calibration circuit is included in a DDR SDRAM physical layer circuit and configured to calibrate the phase difference between a data input/output signal and a data strobe signal in a calibration mode, and the calibration circuit includes a multiphase clock generator, a calibration control circuit, an access control circuit, a comparison circuit, and a phase controller. The multiphase clock generator is configured to provide a plurality of clocks for the DDR SDRAM physical layer circuit and thereby allow the DDR SDRAM physical layer circuit to generate the data input/output signal and the data strobe signal according to the plurality of clocks, in which the data input/output signal and the data strobe signal are used for accessing a storage circuit. The calibration control circuit is configured to output a phase control signal according to a phase difference adjustment range for adjusting the phase of a target signal and output a calibration control signal, in which the target signal is one of the data input/output signal and the data strobe signal. The access control circuit is configured to have predetermined data be written into the storage circuit and storage data representing the predetermined data be read from the storage circuit according to the calibration control signal. The comparison circuit is configured to compare the predetermined data with the storage data to output a comparison result to the calibration control circuit, in which when the comparison result indicates that the storage data is different from the predetermined data, the calibration control circuit narrows the phase difference adjustment range according to the comparison result and outputs the phase control signal and the calibration control signal again. The phase controller is configured to output a clock control signal according to the phase control signal and thereby set the phase of a target clock by the clock control signal, in which the target clock is used for the DDR SDRAM physical layer circuit generating the target signal.

The present invention also discloses a memory signal phase difference calibration method used for calibrating the phase difference between a first signal and a second signal (e.g., a data input/output signal and a data strobe signal) in a calibration mode. An embodiment of the method includes the following steps: providing a plurality of clocks for a DDR SDRAM physical layer circuit and thereby allowing the DDR SDRAM physical layer circuit to generate the first signal and the second signal according to the plurality of clocks, in which the first signal and the second signal are used for accessing a storage circuit; outputting a phase control signal according to a phase difference adjustment range to adjust the phase of a target signal and outputting a calibration control signal, in which the target signal is one of the first signal and the second signal; having predetermined data be written into the storage circuit and storage data representing the predetermined data be read from the storage circuit according to the calibration control signal; comparing the predetermined data with the storage data to output a comparison result, and when the comparison result indicates that the storage data is different from the predetermined data, narrowing the phase difference adjustment range according to the comparison result and then outputting the phase control signal and the calibration control signal again; and outputting a clock control signal according to the phase control signal and thereby setting the phase of a target clock of the plurality of clocks by the clock control signal, wherein the target clock is used for the DDR SDRAM physical layer circuit generating the target signal.

Another embodiment of the method of the present invention is also used for calibrating the phase difference between a first signal and a second signal (e.g., a data input/output signal and a data strobe signal) that are used for accessing a storage circuit. This embodiment includes the following steps: outputting a phase control signal according to a phase difference adjustment range to adjust the phase difference, and outputting a calibration control signal; having storage data representing predetermined data be read from the storage circuit according to the calibration control signal; comparing the predetermined data with the storage data to output a comparison result, and when the comparison result indicates that the storage data is different from the predetermined data, narrowing the phase difference adjustment range according to the comparison result and then outputting the phase control signal and the calibration control signal again; and outputting a clock control signal according to the phase control signal and thereby setting the phase of a target clock by the clock control signal, wherein the target clock is used for generating one of the first signal and the second signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a memory signal phase difference calibration circuit and a memory signal phase difference calibration method that are applicable to a Double Data Rate Synchronous Dynamic Random Access Memory (DDR SDRAM) physical layer circuit. The calibration circuit and method are capable of calibrating the phase difference between a data input/output signal (hereafter: DQ) and a data strobe signal (hereafter: DQS) that are well-defined in a DDR standard and used for accessing a storage circuit, and thus the phase difference between DQ and DQS can comply with the requirement of the DDR standard such as LPDDR4 standard, DDR4 standard or LPDDR3 standard. The background knowledge of the present invention can be found in the disclosure of Applicant's US patent (U.S. Pat. No. 9,570,130 B2).

Figure 1:
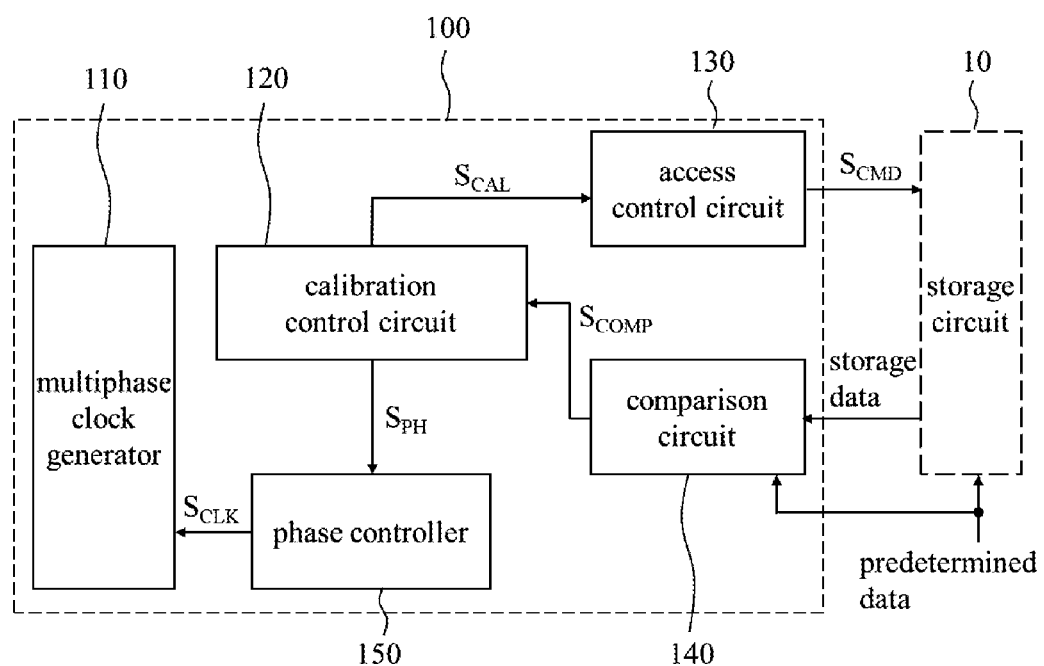
FIG. 1 shows an embodiment of the memory signal phase difference calibration circuit of the present invention.

FIG. 1 shows an embodiment of the memory signal phase difference calibration circuit of the present invention. The memory signal phase difference calibration circuit 100 is included in a DDR SDRAM physical layer circuit (not shown) and configured to calibrate the phase difference between DQ and DQS in a calibration mode. The memory signal phase difference calibration circuit 100 includes a multiphase clock generator 110, a calibration control circuit 120, an access control circuit 130, a comparison circuit 140, and a phase controller 150. A storage circuit 10 as shown in FIG. 1 can be integrated into or independent of the calibration circuit of the present invention.

The multiphase clock generator (e.g., phase-locked loop, PLL with one or more phase interpolators) 110 is configured to provide a plurality of clocks for the DDR SDRAM physical layer circuit and thereby allow the DDR SDRAM physical layer circuit to generate DQ and DQS according to the plurality of clocks, in which DQ and DQS are used for accessing a storage circuit 10. The multiphase clock generator 110 is also configured to adjust the phase of at least one of the clocks according to the control of the phase controller 150. The multiphase clock generator 110 may be further configured to provide clocks for the other circuits of the calibration circuit 100 for their operation. Since the multiphase clock generator 110 can be a known or self-developed circuit, its detail is omitted here.

The calibration control circuit 120 is configured to output a phase control signal $S_{PH}$ according to a phase difference within a phase difference adjustment range so as to adjust the phase of a target signal, and the calibration control circuit 120 is also configured to output a calibration control signal $S_{CAL}$. The target signal is DQ or DQS; once the phase of the target signal is adjusted, the phase difference between DQ and DQS will be changed, and then the calibration circuit 120 can start a data access operation by the calibration control signal $S_{CAL}$ to measure the correctness of data access under such phase difference. An instance of the above-mentioned phase difference adjustment range is not narrower than a range between 200 picoseconds and 800 picoseconds.

The access control circuit 130 is configured to generate a command signal $S_{CMD}$ according to the calibration control signal $S_{CAL}$ to have predetermined data be written into the storage circuit 10 and storage data representing the predetermined data be read from the storage circuit 10. An embodiment of the access control circuit 130 is a multi-purpose command (MPC) circuit functioning in compliance with LPDDR4 standard; in this case the aforementioned calibration mode may become effective, that is to say the access control circuit 130 enters the calibration mode, during the execution of memory refresh of the storage circuit 10 or during a host (not shown), coupled to the storage circuit 10, carrying out a booting process. It should be noted that the calibration mode may become effective several times in several rounds of the execution of memory refresh if the calibration circuit 100 needs more time to finish one round of calibration. Another embodiment of the access control circuit 130 is a read/write control circuit in compliance with another DDR standard (e.g., DDR4 or LPDDR3 standard); in this case the calibration mode may become effective during a host, coupled to the storage circuit 10, carrying out a booting process. Since each of the MPC command circuit and the read/write control circuit can be a known or self-developed circuit, its detail is omitted here.

The comparison circuit 140 is configured to compare the predetermined data with the storage data to output a comparison result $S_{COMP}$ to the calibration control circuit 120. When the comparison result $S_{COMP}$ indicates that the storage data is different from the predetermined data, the phase difference between DQ and DQS is likely to be inappropriate for the data access operation of the storage circuit 10, and thus the calibration control circuit 120 narrows the phase difference adjustment range according to the comparison result $S_{COMP}$ and outputs the phase control signal $S_{PH}$ and the calibration control signal $S_{CAL}$ again for the next round of calibration. On the other hand, when the comparison result $S_{COMP}$ indicates that the storage data is identical to the predetermined data, the phase difference between DQ and DQS is acceptable, and the calibration control circuit 120 keeps the phase difference adjustment range unchanged; afterwards the calibration control circuit 120 stops calibration until a trigger event such as a host booting process or a predetermined countdown is satisfied, or the calibration control circuit 120 starts a next round of calibration by adjusting the phase of the target signal (i.e., DQ or DQS) according to another phase difference within the phase difference adjustment range. In addition, when the calibration control circuit 120 determines to stop calibration, the calibration control circuit 120 can optionally have the phase difference be equal to a middle of the phase difference adjustment range, or have a difference between the phase difference and the middle be less than a threshold. The threshold may be between 0 picoseconds and 20 picoseconds, but the present invention is not limited thereto.

The phase controller 150 is configured to output a clock control signal $S_{CLK}$ according to the phase control signal $S_{PH}$ and thereby set the phase of a target clock of the plurality of clocks by the clock control signal $S_{CLK}$, in which the target clock is used for the DDR SDRAM physical layer circuit generating the target signal (i.e., DQ or DQS).

In an exemplary implementation of the embodiment of FIG. 1, the phase difference adjustment range is defined by a minimum phase difference and a maximum phase difference and each of the minimum phase difference and the maximum phase difference is used for setting the phase difference between DQ and DQS. In detail, the calibration control circuit 120 adjusts the phase of the target signal (i.e., DQ or DQS) in order to let the phase difference be a first phase difference (i.e., one of the minimum phase difference and the maximum phase difference) so that the comparison circuit 140 outputs a first-time result as the comparison result; afterwards the calibration control circuit 120 adjusts the phase of the target signal to let the phase difference be a second phase difference (i.e., the other one of the minimum phase difference and the maximum phase difference) so that the comparison circuit outputs a second-time result as the comparison result; and when at least one result of the first-time result and the second-time result indicates that the storage data is different from the predetermined data, the calibration control circuit 120 narrows the phase difference adjustment range according to the at least one result. More specifically, when the first-time result indicates that the storage data is different from the predetermined data but the second-time result indicates that the storage data is identical to the predetermined data, the calibration control circuit 120 adjusts the first phase difference to narrow the phase difference adjustment range (e.g., 180~820 picoseconds→200~820 picoseconds); when the second-time result indicates that the storage data is different from the predetermined data but the first-time result indicates that the storage data is identical to the predetermined data, the calibration control circuit 120 adjusts the second phase difference to narrow the phase difference adjustment range (e.g., 180~820 picoseconds→180~800 picoseconds); when both the first-time result and the second-time result indicate that the storage data is different from the predetermined data, the calibration control circuit 120 adjusts the first phase difference and then adjusts the second phase difference to narrow the phase difference adjustment range (e.g., 180~820 picoseconds→200~800 picoseconds); and when both the first-time result and the second-time result indicate that the storage data is identical to the predetermined data, the calibration control circuit determines to finish calibrating the phase difference.

It should be noted that the embodiment of FIG. 1 can adjust the phase difference between two memory signals other than DQ and DQS to have the phase difference comply with a DDR standard or other kinds of requirements. Those of ordinary skill in the art can appreciate how to modify the embodiment of FIG. 1 for the above-mentioned utilization according to the present disclosure, if necessary.

Figure 2:
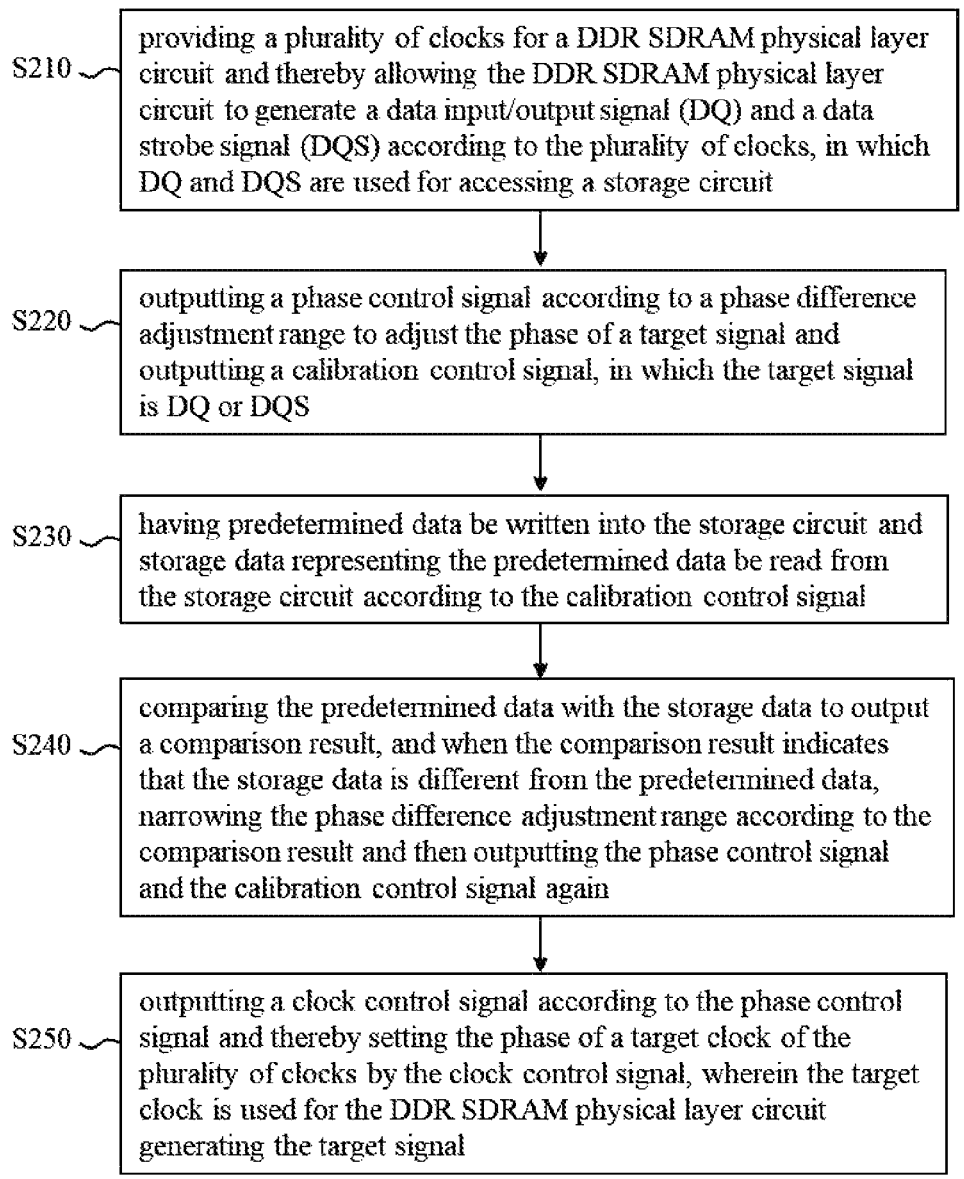
FIG. 2 shows an embodiment of the memory signal phase difference calibration method of the present invention.

FIG. 2 shows an embodiment of the memory signal phase difference calibration method of the present invention. As shown in FIG. 2, the embodiment includes the following steps:

Step S210: providing a plurality of clocks for a DDR SDRAM physical layer circuit and thereby allowing the DDR SDRAM physical layer circuit to generate a data input/output signal (DQ) and a data strobe signal (DQS) according to the plurality of clocks, in which DQ and DQS are used for accessing a storage circuit. This step can be carried out by the multiphase clock generator 110 of FIG. 1 or the equivalent thereof.

Step S220: outputting a phase control signal according to a phase difference adjustment range to adjust the phase of a target signal and outputting a calibration control signal, in which the target signal is DQ or DQS. This step can be carried out by the cooperation of the calibration control circuit 120, the phase controller 150, and the multiphase clock generator 110 of FIG. 1 or the equivalent of the said cooperation.

Step S230: having predetermined data be written into the storage circuit and storage data representing the predetermined data be read from the storage circuit according to the calibration control signal. This step can be carried out by the access control circuit 130 of FIG. 1 or the equivalent thereof.

Step S240: comparing the predetermined data with the storage data to output a comparison result, and when the comparison result indicates that the storage data is different from the predetermined data, narrowing the phase difference adjustment range according to the comparison result and then outputting the phase control signal and the calibration control signal again. This step can be carried out by the cooperation of the comparison circuit 140 and the calibration control circuit 120 of FIG. 1 or the equivalent of the said cooperation.

Step S250: outputting a clock control signal according to the phase control signal and thereby setting the phase of a target clock of the plurality of clocks by the clock control signal, wherein the target clock is used for the DDR SDRAM physical layer circuit generating the target signal. This step can be carried out by the cooperation of the phase controller 150 and the multiphase clock generator 110 of FIG. 1 or the equivalent of the said cooperation.

Figure 3:
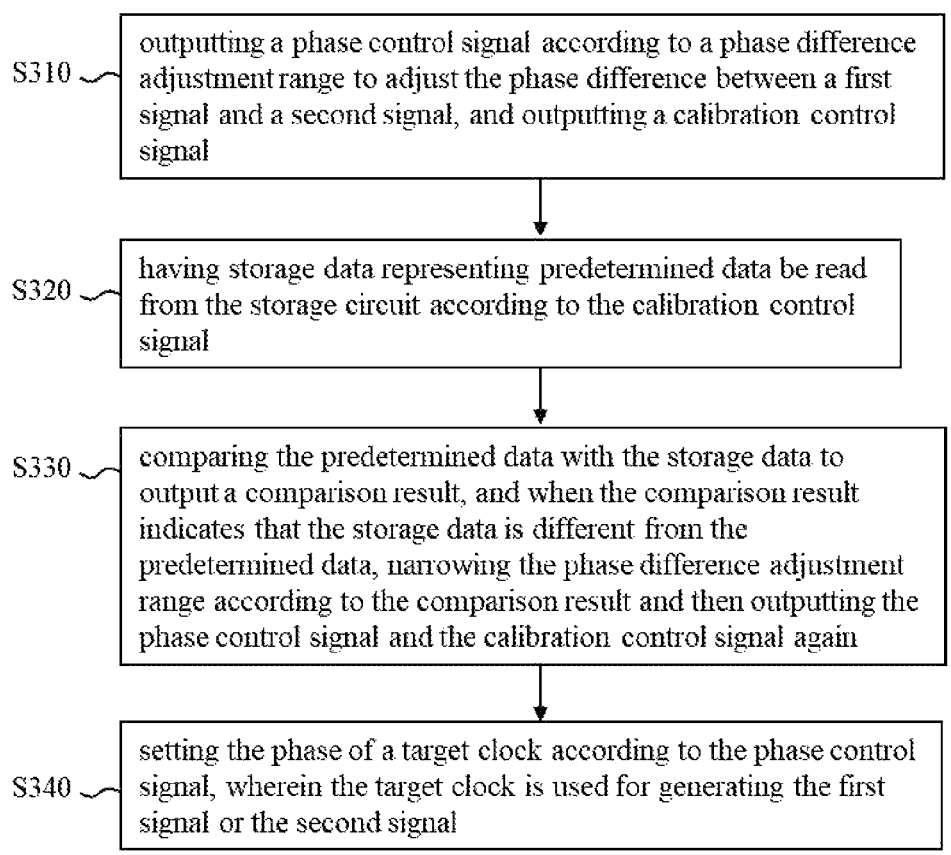
FIG. 3 shows another embodiment of the memory signal phase difference calibration method of the present invention.

FIG. 3 shows another embodiment of the memory signal phase difference calibration method of the present invention. As shown in FIG. 3, the embodiment includes the following steps:

Step S310: outputting a phase control signal according to a phase difference adjustment range to adjust the phase difference between a first signal (e.g., DQ) and a second signal (e.g., DQS), and outputting a calibration control signal. This step can be carried out by the cooperation of the calibration control circuit 120, the phase controller 150, and the multiphase clock generator 110 of FIG. 1 or the equivalent of the said cooperation.

Step S320: having storage data representing predetermined data be read from the storage circuit according to the calibration control signal. This step can be carried out by the access control circuit 130 of FIG. 1 or the equivalent thereof.

Step S330: comparing the predetermined data with the storage data to output a comparison result, and when the comparison result indicates that the storage data is different from the predetermined data, narrowing the phase difference adjustment range according to the comparison result and then outputting the phase control signal and the calibration control signal again. This step can be carried out by the cooperation of the comparison circuit 140 and the calibration control circuit 120 of FIG. 1 or the equivalent of the said cooperation.

Step S340: setting the phase of a target clock according to the phase control signal, wherein the target clock is used for generating the first signal or the second signal. This step can be carried out by the cooperation of the phase controller 150 and the multiphase clock generator 110 of FIG. 1 or the equivalent of the said cooperation.

It should be noted that the steps in FIG. 2 or FIG. 3 could be executed in different sequence as long as such execution is practicable.

Since those of ordinary skill in the art can appreciate the detail and the modification of the embodiments of FIGS. 2-3 by referring to the disclosure of the embodiment of FIG. 1, which implies that some or all of the features of the embodiment of FIG. 1 can be applied to each of the embodiments of FIGS. 2-3 in a reasonable way, and vice versa, repeated and redundant description is omitted here.

To sum up, the memory signal phase difference calibration circuit and method of the present invention can have the phase difference between two memory signals (e.g., DQ and DQS) comply with LPDDR4 standard or other requirements.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A memory signal phase difference calibration circuit, the memory signal phase difference calibration circuit included in a Double Data Rate Synchronous Dynamic Random Access Memory (DDR SDRAM) physical layer circuit and configured to calibrate a phase difference between a data input/output signal and a data strobe signal in a calibration mode, the memory signal phase difference calibration circuit comprising:
   a multiphase clock generator configured to provide a plurality of clocks for the DDR SDRAM physical layer circuit and thereby allow the DDR SDRAM physical layer circuit to generate the data input/output signal and the data strobe signal according to the plurality of clocks, in which the data input/output signal and the data strobe signal are used for accessing a storage circuit;
   a calibration control circuit configured to output a phase control signal according to a phase difference adjustment range for adjusting a phase of a target signal and output a calibration control signal, in which the target signal is one of the data input/output signal and the data strobe signal;
   an access control circuit configured to have predetermined data be written into the storage circuit and storage data representing the predetermined data be read from the storage circuit according to the calibration control signal;
   a comparison circuit configured to compare the predetermined data with the storage data to output a comparison result to the calibration control circuit, in which when the comparison result indicates that the storage data is different from the predetermined data, the calibration control circuit narrows the phase difference adjustment range according to the comparison result and outputs the phase control signal and the calibration control signal again; and
   a phase controller configured to output a clock control signal according to the phase control signal and thereby set a phase of a target clock by the clock control signal, in which the target clock is used for the DDR SDRAM physical layer circuit generating the target signal.

2. The memory signal phase difference calibration circuit of claim 1, wherein the access control circuit is a multi-purpose command circuit functioning in compliance with Low Power Double Data Rate fourth generation (LPDDR4) standard.

3. The memory signal phase difference calibration circuit of claim 1, wherein the access control circuit is a read/write control circuit functioning in compliance with Double Data Rate fourth generation (DDR4) standard or Low Power Double Data Rate third generation (LPDDR3) standard.

4. The memory signal phase difference calibration circuit of claim 1, wherein the calibration mode becomes effective during execution of memory refresh of the storage circuit.

5. The memory signal phase difference calibration circuit of claim 4, wherein the calibration mode becomes effective several times in one round of calibration carried out by the memory signal phase difference calibration circuit.

6. The memory signal phase difference calibration circuit of claim 1, wherein the storage circuit is coupled to a host and the calibration mode becomes effective during the host carrying out a booting process.

7. The memory signal phase difference calibration circuit of claim 1, wherein the phase difference adjustment range is defined by a minimum phase difference and a maximum phase difference and each of the minimum phase difference and the maximum phase difference is used for setting the phase difference between the data input/output signal and the data strobe signal.

8. The memory signal phase difference calibration circuit of claim 7, wherein the calibration control circuit adjusts the phase of the target signal in order to let the phase difference be a first phase difference so that the comparison circuit outputs a first-time result as the comparison result; the calibration control circuit adjusts the phase of the target signal to let the phase difference be a second phase difference so that the comparison circuit outputs a second-time result as the comparison result; when at least one result of the first-time result and the second-time result indicates that the storage data is different from the predetermined data, the calibration control circuit narrows the phase difference adjustment range according to the at least one result; and the first phase difference is one of the minimum phase difference and the maximum phase difference while the second phase difference is the other one.

9. The memory signal phase difference calibration circuit of claim 8, wherein when the first-time result indicates that the storage data is different from the predetermined data but the second-time result indicates that the storage data is identical to the predetermined data, the calibration control circuit adjusts the first phase difference to narrow the phase difference adjustment range; when the second-time result indicates that the storage data is different from the predetermined data but the first-time result indicates that the storage data is identical to the predetermined data, the calibration control circuit adjusts the second phase difference to narrow the phase difference adjustment range; when both the first-time result and the second-time result indicate that the storage data is different from the predetermined data, the calibration control circuit adjusts the first phase difference and then adjusts the second phase difference to narrow the phase difference adjustment range; and when both the first-time result and the second-time result indicate that the storage data is identical to the predetermined data, the calibration control circuit determines to finish calibrating the phase difference.

10. The memory signal phase difference calibration circuit of claim 1, wherein the phase difference adjustment range is not narrower than a range between 200 picoseconds and 800 picoseconds.

11. The memory signal phase difference calibration circuit of claim 1, wherein when the comparison result indicates that the storage data is identical to the predetermined data and the calibration control circuit determines to finish calibrating the phase difference, the calibration control circuit has the phase difference be equal to a middle of the phase difference adjustment range, or has a difference between the phase difference and the middle be less than a threshold.

12. A memory signal phase difference calibration method, the memory signal phase difference calibration method used for calibrating a phase difference between a first signal and a second signal in a calibration mode, the memory signal phase difference calibration method comprising:
   providing a plurality of clocks for a Double Data Rate Synchronous Dynamic Random Access Memory (DDR SDRAM) physical layer circuit and thereby allowing the DDR SDRAM physical layer circuit to generate the first signal and the second signal according to the plurality of clocks, in which the first signal and the second signal are used for accessing a storage circuit;

outputting a phase control signal according to a phase difference adjustment range to adjust a phase of a target signal and outputting a calibration control signal, in which the target signal is one of the first signal and the second signal;

having predetermined data be written into the storage circuit and storage data representing the predetermined data be read from the storage circuit according to the calibration control signal;

comparing the predetermined data with the storage data to output a comparison result, and when the comparison result indicates that the storage data is different from the predetermined data, narrowing the phase difference adjustment range according to the comparison result and then outputting the phase control signal and the calibration control signal again; and outputting a clock control signal according to the phase control signal and thereby setting a phase of a target clock of the plurality of clocks by the clock control signal, wherein the target clock is used for the DDR SDRAM physical layer circuit generating the target signal.

13. The memory signal phase difference calibration method of claim 12, wherein the calibration mode becomes effective during execution of memory refresh of the storage circuit.

14. The memory signal phase difference calibration method of claim 13, wherein the calibration mode becomes effective several times in one round of calibration.

15. The memory signal phase difference calibration method of claim 12, wherein the storage circuit is coupled to a host and the calibration mode becomes effective during the host carrying out a booting process.

16. The memory signal phase difference calibration method of claim 12, wherein the phase difference adjustment range is defined by a minimum phase difference and a maximum phase difference and each of the minimum phase difference and the maximum phase difference is used for setting the phase difference between the first signal and the second signal.

17. The memory signal phase difference calibration method of claim 16, further comprising: adjusting the phase of the target signal according to the minimum phase difference and the maximum phase difference respectively and thereby obtaining a first-time result as the comparison result and a second-time result as the comparison result; and when at least one result of the first-time result and the second-time result indicates that the storage data is different from the predetermined data, narrowing the phase difference adjustment range according to the at least one result.

18. The memory signal phase difference calibration method of claim 12, further comprising: when the comparison result indicates that the storage data is identical to the predetermined data, having the phase difference be equal to a middle of the phase difference adjustment range, or having a difference between the phase difference and the middle be less than a threshold.

19. A memory signal phase difference calibration method, the memory signal phase difference calibration method used for calibrating a phase difference between a first signal and a second signal which are used for accessing a storage circuit, the memory signal phase difference calibration method comprising:

outputting a phase control signal according to a phase difference adjustment range to adjust the phase difference, and outputting a calibration control signal;

having storage data representing predetermined data be read from the storage circuit according to the calibration control signal;

comparing the predetermined data with the storage data to output a comparison result, and when the comparison result indicates that the storage data is different from the predetermined data, narrowing the phase difference adjustment range according to the comparison result and then outputting the phase control signal and the calibration control signal again; and setting a phase of a target clock according to the phase control signal, wherein the target clock is used for generating one of the first signal and the second signal.

20. The memory signal phase difference calibration method of claim 19, further comprising: when the comparison result indicates that the storage data is identical to the predetermined data, having the phase difference be equal to a middle of the phase difference adjustment range, or having a difference between the phase difference and the middle be less than a threshold.

* * * * *